United States Patent [19]
Kim

[11] Patent Number: 6,037,203
[45] Date of Patent: Mar. 14, 2000

[54] METHOD OF FABRICATING A SEMICONDUCTOR DEVICE HAVING TRIPLE WELL STRUCTURE

[75] Inventor: Jae-Kap Kim, Kyoungki-do, Rep. of Korea

[73] Assignee: Hyundai Electronics Industries Co., Ltd, Kyoungki-do, Rep. of Korea

[21] Appl. No.: 09/265,545

[22] Filed: Mar. 8, 1999

Related U.S. Application Data

[62] Division of application No. 08/876,351, Jun. 26, 1997, Pat. No. 5,939,757.

[30] Foreign Application Priority Data

Jun. 28, 1996 [KR] Rep. of Korea ............... 96-25024

[51] Int. Cl.$^7$ ............................. H01L 29/76; H01L 29/94
[52] U.S. Cl. ..................... 438/217; 438/218; 257/269; 257/339; 257/376
[58] Field of Search .................... 438/217, 218; 257/269, 339, 376, 351, 369, 371, 406

[56] References Cited

U.S. PATENT DOCUMENTS

| | | | |
|---|---|---|---|
| 4,600,933 | 7/1986 | Richman | 357/23.12 |
| 5,156,989 | 10/1992 | Williams et al. | 437/41 |
| 5,321,291 | 6/1994 | Redwine | 257/341 |
| 5,350,939 | 9/1994 | Honda et al. | 257/378 |
| 5,548,143 | 8/1996 | Lee | 257/269 |
| 5,554,883 | 9/1996 | Kuroi | 257/617 |
| 5,739,572 | 4/1998 | Noguchi | 257/371 |

FOREIGN PATENT DOCUMENTS

| | | |
|---|---|---|
| 0708482 | 4/1996 | European Pat. Off. . |
| 5-315557 | 11/1993 | Japan . |
| 6-53423 | 2/1994 | Japan . |
| 6-53428 | 2/1994 | Japan . |

*Primary Examiner*—Charles Bowers
*Assistant Examiner*—David S Blum
*Attorney, Agent, or Firm*—Ware, Fressola, Van Der Sluys & Adolphson LLP

[57] ABSTRACT

The present invention discloses a semiconductor device having a triple well structure. The semiconductor device includes a N-type impurity doped buried layer, formed in the semiconductor substrate at a predetermined depth from the surface of the first active region; a first P-type well region formed beneath the second active region which is adjacent to the first active region; a second P-type well region formed in the semiconductor substrate to a depth from the surface of the first active region; a first N-type well region formed beneath the third active region; a second N-type well region formed beneath selected portion of the isolation film defining first active region and the second active region; and a first P-type doping region and a second N-type doping region formed respectively right beneath the surface of the first active region and right beneath the surface of the second active region, wherein the dopant concentration of the first doping region is lower than that of the second doping region.

14 Claims, 2 Drawing Sheets

METHOD OF FABRICATING A SEMICONDUCTOR DEVICE HAVING TRIPLE WELL STRUCTURE

CROSS-REFERENCE TO RELATED APPLICATION

This application is a divisional of U.S. patent application Ser. No. 08/876,351, filed Jun. 26, 1997 now U.S. Pat. No. 5,939,757, from which priority is claimed under 35 USC §120.

BACKGROUND OF THE INVENTION

1. Field of the Invention

The present invention relates to a semiconductor device and a fabrication method thereof, and more particularly to a semiconductor device having a triple well structure and a fabrication method thereof.

2. Description of the Prior Art

To meet with the high integration and functional sophistication of semiconductor devices, an integrated circuit generally should be capable of providing special performances. For this purpose, a number of improved semiconductor devices have been developed. In one such improvement, a first P-type well is formed in a P-type substrate, and a second P-type well is formed in a N-type well which is formed in the P-type substrate. Accordingly, a first N-type MOS transistor is formed in the first P-type well, and a second N-type MOS transistor is formed in the second P-type well. The first N-type MOS transistor has properties different from that of the second N-type MOS transistor.

The semiconductor device can be employed in the dynamic RAM. In the dynamic RAM, when a negative voltage having a predetermined value is applied to a semiconductor substrate in a region of a memory cell, parasitic junction capacitance is reduced. Further, quantity of the leakage current in a junction region is reduced. As a result, sensing margin of the semiconductor device and data retention time are increased.

In the conventional semiconductor device as described above, the second P-type well formed in the N-type well is electrically insulated with the first P-type well, and in contrast, to the first P-type well, a negative voltage having a predetermined value is applied to the second P-type well. Accordingly, there is a problem in that threshold voltage in the second P-type well is increased.

Furthermore, since the second P-type well is formed in the N-type well, the characteristic of the second P-type well is deteriorated.

SUMMARY OF THE INVENTION

The first object of the present invention is to provide a semiconductor device and a fabrication method of the same, which is capable of minimizing the threshold voltage difference between the first P-type well and the second P-type well when a negative voltage is applied to a substrate where the second P-type well is formed, and which is capable of minimizing the manufacturing process of the semiconductor device.

The second object of the present invention is to provide a semiconductor device and a fabrication method of the same which has an improved well characteristics where the second P-type well is not formed in the N-type well.

In order to achieve the above objects, the present invention provides a semiconductor device, including:

a semiconductor substrate doped by P-type impurity;

a plurality of isolation films for defining first, second, and third active regions in an unit cell of the semiconductor substrate;

a N-type impurity doped buried layer, the buried layer being formed in the semiconductor substrate at a predetermined depth from the surface of the first active region wherein the surface includes portions of the isolation films which are positioned at both sides of the first active region;

a first P-type well region formed beneath the second active region which is adjacent to the first active region;

a second P-type well region formed in the semiconductor substrate to a predetermined depth from the surface of the first active region where the second P-type well region is separated at a predetermined distance from the buried-impurity layer;

a first N-type well region formed beneath the third active region;

a second N-type well region formed beneath selected portion of the isolation film defining first active region and the second active region; and a first P-type doping region and a second N-type doping region formed respectively right beneath the surface of the first active region and right beneath the surface of the second active region, wherein the dopant concentration of the first doping region is lower than that of the second doping region.

In addition, in order to achieve the above objects, the present invention provide a method of fabricating a semiconductor device, including the steps of:

providing a semiconductor substrate doped with P-type impurity;

forming a plurality of isolation films for defining first, second and third active regions in an unit cell of said semiconductor substrate;

forming a N-type impurity doped buried layer at a predetermined depth of the semiconductor substrate from the surface of the first active region and a surface of a region including predetermined portions of the isolation films that lie at both sides of said first active region;

forming a first N-type well region beneath the region including the third active region and predetermined portions of the isolation films that lie at the both sides of the third active region, and a second N-type well region beneath predetermined portion of the isolation film that lies between said first active region and the second active region;

forming a third P-type well beneath the region including the second active region and predetermined portions of the isolation films that lie at both sides of the second active region, and a fourth P-type well region beneath the first active region and predetermined portions of the isolation films that lie at both sides of the first active region; and forming a first doping region and a second doping region for controlling a threshold voltage respectively in the region adjacent to the surface of the first active region and in the region adjacent to the surface of said second active region, wherein dopant concentration of the first doping region is lower than that of the second doping region.

BRIEF DESCRIPTION OF THE DRAWINGS

The above object and other characteristics and advantages of the present invention will become more apparent by describing in detail a preferred embodiment thereof with reference to the attached drawings, in which.

DETAILED DESCRIPTION OF THE INVENTION

Hereinafter, the preferred embodiment of the present invention will be explained in more detail with reference to the accompanying drawings.

FIGS. 1A to 1D are schematic sectional views of a semiconductor device according to a preferred embodiment of the present invention.

Figure 1A:
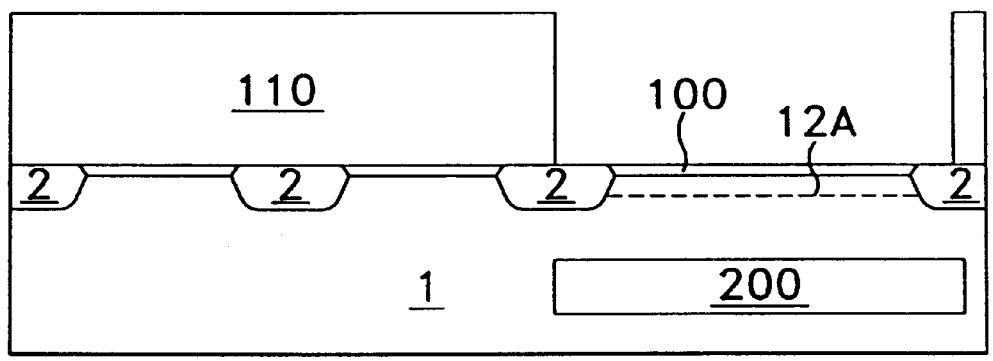
FIGS. 1A to 1D are schematic sectional views of a semiconductor device according to a preferred embodiment of the present invention, showing the fabrication process of the semiconductor device.

Referring to FIG. 1A, a plurality of isolation films 2 are formed at predetermined regions of a P-type semiconductor substrate 1. The plurality of isolation films 2 define first, second, and third active regions from the right in FIG. 1A in the P-type semiconductor substrate 1. A screen oxide film 100 for preventing the P-type semiconductor substrate 1 from being damaged is then formed by a commonly known method on the total structure. Thereafter, a first mask pattern 110, which is a photosensitive film, is formed so that the first active region is exposed. The preferred thickness of the first mask pattern 110 is about 3 to 5 $\mu$m. A phosphorus ion, which is an N-type impurity, is then implanted into the P-type semiconductor substrate 1 at an energy of 1~2 MeV and at an ion concentration of $1 \times 10^{12}$ to $5 \times 10^{13}$ ions/cm$^2$. Accordingly a N-type impurity-buried layer 200 is formed in the P-type semiconductor substrate 1 at a predetermined depth.

Thereafter, in order to control the threshold voltage of the semiconductor device, an N-type dopant, for example, phosphorus(P) ions, is implanted into the semiconductor substrate 1 at an energy of 30~80 KeV and at an ion concentration of $2 \times 10^{11}$ to $5 \times 10^{11}$ ions/cm$^2$. As a result, a first threshold voltage controlling layer 12A is formed at region adjacent to the surface of the first active region. The first mask pattern 110 is then removed using a well known photosensitive film removal technique.

Figure 1B:
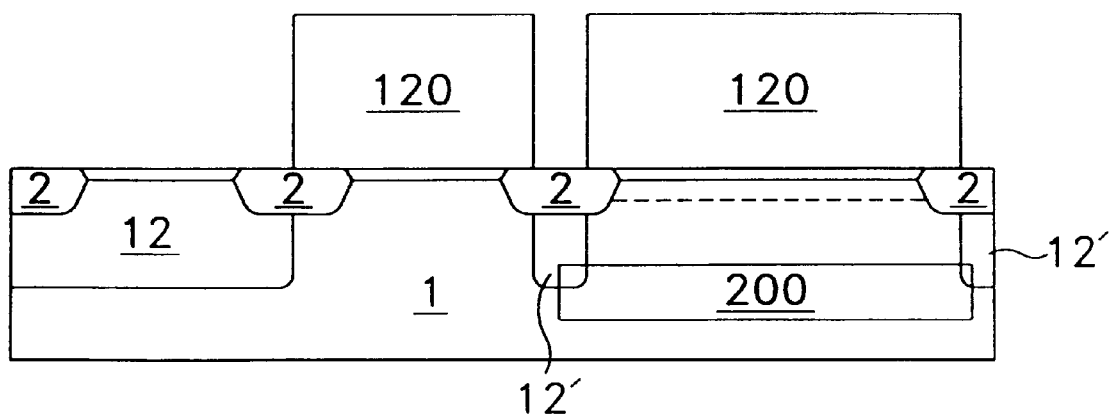

Next, referring to FIG. 1B, the second mask pattern 120 is formed on the first and second active regions by using a photolithography technique. The second mask pattern is formed so that not only the desired region of the N-type well but predetermined portion of the isolation film 2 between the first active region and the second active region, are exposed. Preferably, the second mask pattern 120 has a thickness of about 2 to 4 $\mu$m. After forming the second mask pattern 120, phosphorus ions, which are of a N-type impurity, are implanted into the semiconductor substrate 1 at an energy level of 700 KeV~1.5 MeV and at an ion concentration of $5 \times 10^{12}$ to $5 \times 10^{13}$ ions/cm$^2$. At this time, the second mask pattern 120 is used as an ion-implantation mask. As a result, a first N-type well 12 and a second N-type well 12' are formed in the P-type semiconductor substrate 1. Portions of the second N-type well 12' overlap with both edge portions of the N-type buried impurity layer 200. Thereafter, the second mask pattern 120 is removed by using the well known photosensitive film removal technique.

Figure 1C:
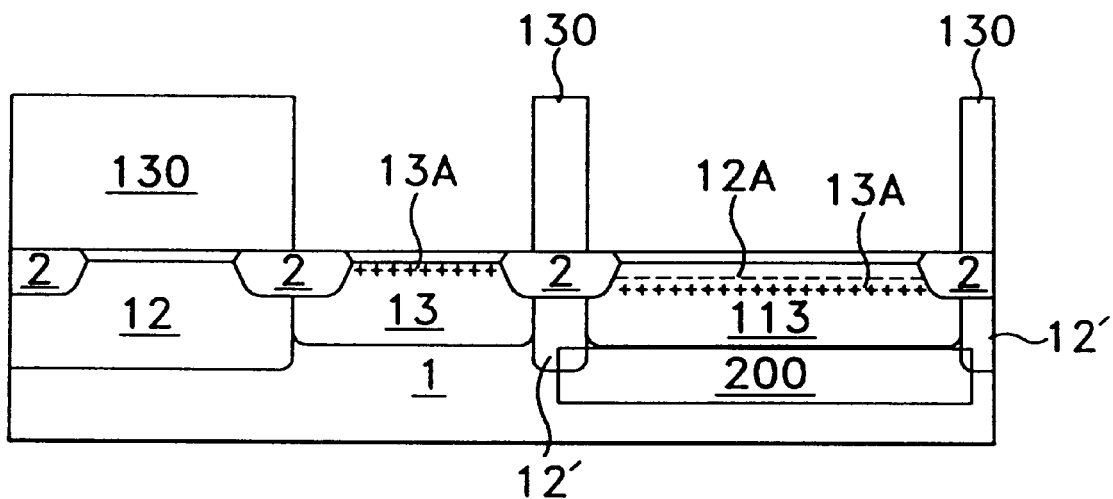

Referring to FIG. 1C, a third mask pattern 130 is formed on the third active region and the predetermined region of the isolation film 2 between the first active region and the second active region by using the photolithography technique so that only the desired P-type well region is exposed. Preferably, the third mask pattern 130 has a thickness of 2~4 $\mu$m. P-type impurity ions, for example boron ions, are then implanted into the semiconductor substrate 1 at an energy level of 500 KeV~700 KeV and at an ion concentration of $1 \times 10^{13}$ to $5 \times 10^{13}$ ions/cm$^2$ whereby a first P-type well 13 and a second P-type well 113 are formed. In the present invention, the second P-type well 13 is formed in a portion of the P-type semiconductor substrate 1 which is enclosed by the N-type impurity buried layer 200 and the second N-type well 12', in contrast to the conventional semiconductor device wherein the P-type second well 113 is not formed inside the N well.

Thereafter, in order to control the threshold voltage of the semiconductor device, P-type impurity ions, for example boron, are implanted into the semiconductor substrate 1 at an energy level of 70~120 KeV and at an ion concentration of $2 \times 10^{11}$ to $5 \times 10^{11}$ ions/cm$^2$ followed by a second boron ion implantation into the semiconductor substrate 1 at an energy level of 10~30 KeV and at an ion concentration of $1 \times 10^{12}$ to $5 \times 10^{12}$ ions/cm$^2$. Accordingly, a second threshold voltage controlling layer 13A is formed at region adjacent to the surfaces of the first P-type well and the second P-type well. Since the first N-type threshold voltage controlling layer 12A and the second P-type threshold voltage controlling layer are formed in the same second P-type well 113, the two layers 12A, 13A are counter-doped. As a result, compared to the threshold voltage controlling layer 13A formed in the first P-type well 13, the threshold voltage controlling layer has a lower concentration of the dopant. Accordingly, the threshold voltage of the second P-type well 113 is lower than that of the first P-type well 13.

Figure 1D:
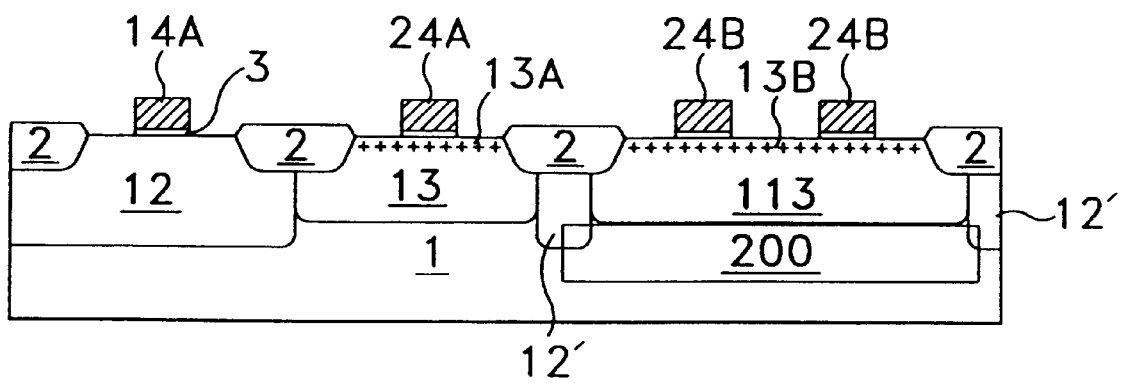

Referring to FIG. 1D, after removing the third mask pattern and rinsing the structure, gate oxide film 3 and gate electrodes 14A, 24A, 24B are formed by a conventional method on the structure. Meanwhile, a third threshold voltage controlling layer 13B in FIG. 1D designates an impurity layer formed by counter-doping the first threshold voltage controlling layer 12A and the second threshold voltage controlling layer 13A. As described foregoing, the third threshold voltage controlling layer 13B has a relatively low dopant concentration.

In the semiconductor device as formed by the method above, a ground voltage is applied to the first P-type well 13, and a negative voltage is applied to the second P-type well 113. Since the third threshold voltage controlling layer 13B formed in the second P-type well 113 has a concentration lower than that of the first threshold voltage controlling layer 13A formed in the first P-type well 13, the threshold voltage of the second P-type well 113 is lower than that of the first P-type well 13. Accordingly, although an additional electrical voltage is applied to the semiconductor device, a threshold voltage of a MOS transistor formed in the first P-type well is the same as that of a MOS transistor formed in the second P-type well.

According to the present invention, the second P-type well 113 is not formed in the N-type well. The second P-type well is formed in the part of semiconductor substrate which is enclosed by the N-type well and the N type buried impurity layer. Consequently, the characteristics of the P-type well is highly enhanced. Furthermore, the characteristic and the yield of the semiconductor device are enhanced.

While the present invention has been particularly shown and described with reference to a particular embodiment thereof, it will be understood by those skilled in the art that various changes in form and detail may be effected therein without departing from the spirit and scope of the invention as defined by the appended claims.

What is claimed is:

1. A method of fabricating a semiconductor device, comprising the steps of:

providing a semiconductor substrate doped with a first-type impurity;

forming a plurality of isolation films for defining first, second and third active regions in an unit cell of said semiconductor substrate;

forming a second-type impurity doped buried-impurity layer at a predetermined depth of said semiconductor substrate from a surface of said first active region and the surface of region including predetermined portions of said isolation films that lie at both sides of said first active region;

forming a first well region doped with a second-type impurity beneath the region including said third active region and predetermined portions of the isolation films that lie at the both sides of the third active region, and a second well region doped with a second-type impurity beneath predetermined portion of the isolation film that lies between said first active region and said second active region;

forming a third well doped with first-type impurity beneath the region including said second active region and predetermined portions of the isolation films that lie at both sides of the second active region, and a fourth well region doped with a first-type impurity beneath said first active region and predetermined portions of the isolation films that lie at both sides of the first active region; and forming a first doping region and a second doping region for controlling a threshold voltage respectively in the region adjacent to the surface of said first active region and in the region adjacent to the surface of said second active region, wherein dopant concentration of said first doping region is lower than that of said second doping region.

2. The method as claimed in claim 1, wherein said first-type impurity is a P-type impurity, and said second-type impurity is an N-type impurity.

3. The method as claimed in claim 2, wherein the steps of forming a first doping region and a second doping region comprises first and second ion implantation wherein the first ion implantation being N-type impurity implantation and the second ion implantation being P-type impurity implantation.

4. The method as claimed in claim 3, wherein the first ion implantation is performed by implanting phosphorus ions into said first active region at an energy level of 30 to 80 KeV and at an ion concentration level of $2\times10^{11}$ to $5\times10^{12}$ ions/cm$^2$.

5. The method as claimed in claim 3, wherein the second ion implantation is performed by implanting boron ions into said first active region at an energy level of 70 to 120 KeV and at an ion concentration level of $5\times10^{12}$ to $5\times10^{13}$ ions/cm$^2$, and implanting boron ions into said first active region at an energy level of 10 to 30 KeV and at an ion concentration level of $1\times10^{12}$ to $5\times10^{12}$ ions/cm$^2$.

6. The method as claimed in claim 1, wherein said step of forming the buried impurity layer comprises the steps of:

forming a mask pattern exposing said first active region and predetermined portions of the isolation films that lie at both sides of the first active region;

implanting phosphorus atoms at an energy level of 1 to 2 MeV and at an ion concentration level of $1\times10^{12}$ to $5\times10^{13}$ ions/cm$^2$; and removing said mask pattern.

7. The method as claimed in claim 6, wherein said mask pattern has a thickness of 3 to 5 µm.

8. The method as claimed in claim 1, wherein said first well region and said second well region are formed simultaneously.

9. The method as claimed in claim 1, wherein said third well region and said fourth well region are simultaneously formed.

10. The method of producing a semiconductor device as claimed in claim 2, wherein the step of forming said first and second well regions comprises the steps of:

forming a mask pattern exposing said third active region, and predetermined portions of the isolation film that lies between said first active region and said second active region;

implanting phosphorus atoms at an energy level of 700 KeV to 1.5 MeV and at an ion concentration level of $5\times10^{12}$ to $5\times10^{13}$ ions/cm$^2$; and removing said mask pattern.

11. The method as claimed in claim 10, wherein said mask pattern has a thickness of 2 to 4 µm.

12. The method as claimed in claim 2, wherein the step of forming said third well, comprises the steps of:

forming a mask pattern exposing the region including said first active region and predetermined portions of the isolation films that lie at both sides of said first active region, and the region including said second active region and predetermined portions of the isolation films that lie at both sides of said second active region;

implanting boron ions at an energy level of 500 KeV to 700 MeV and an ion concentration level of $1\times10^{13}$ to $5\times10^{13}$ ions/cm$^2$; and removing said mask pattern.

13. The method as claimed in claim 12, wherein said mask pattern has a thickness of 2 to 4 µm.

14. A method of fabricating a semiconductor device, comprising the steps of:

providing a semiconductor substrate doped with a first-type impurity;

forming a plurality of isolation films for defining first, second and third active regions in an unit cell of said semiconductor substrate;

forming N-type impurity doped buried-impurity layer at a predetermined depth of said semiconductor substrate from the surface of said first active region and the surface of region including predetermined portions of said isolation films that lie at both sides of said first active region;

forming a first doping region right beneath the surface of said first active region by implanting N-type impurity into said first active region;

forming a first N-type well region beneath the region including said third active region and predetermined portions of the isolation films that lie at the both sides of the third active region, and a second N-type well region beneath predetermined portion of the isolation film that lies between said first active region and said second active region;

forming a third P-type well beneath the region including said second active region and predetermined portions of the isolation films that lie at both sides of the second active region, and a fourth P-type well region beneath said first active region and predetermined portions of the isolation films that lie at both sides of the first active region; and forming a second doping region and a third doping region respectively right beneath the surface of said first active region and right beneath the surface of said second active region, for controlling a threshold voltage, by implanting P-type impurity.

* * * * *